United States Patent
He et al.

(10) Patent No.: US 9,385,001 B1
(45) Date of Patent: Jul. 5, 2016

(54) SELF-ALIGNED ITO GATE ELECTRODE FOR GAN HEMT DEVICE

(71) Applicant: Toshiba Corporation, Tokyo (JP)

(72) Inventors: Yongxiang He, Sunnyvale, CA (US); Xinyu Zhang, Palo Alto, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/660,281

(22) Filed: Mar. 17, 2015

(51) Int. Cl.
*H01L 21/3213* (2006.01)
*H01L 29/778* (2006.01)
*H01L 29/20* (2006.01)
*H01L 29/205* (2006.01)
*H01L 29/47* (2006.01)
*H01L 29/423* (2006.01)
*H01L 29/66* (2006.01)
*H01L 21/285* (2006.01)
*H01L 21/02* (2006.01)

(52) U.S. Cl.
CPC ...... *H01L 21/32133* (2013.01); *H01L 21/0254* (2013.01); *H01L 21/28581* (2013.01); *H01L 21/32134* (2013.01); *H01L 29/2003* (2013.01); *H01L 29/205* (2013.01); *H01L 29/42316* (2013.01); *H01L 29/475* (2013.01); *H01L 29/66462* (2013.01); *H01L 29/7787* (2013.01)

(58) Field of Classification Search
CPC ............ H01L 21/0254; H01L 21/28581; H01L 21/32133; H01L 21/32134; H01L 29/2003; H01L 29/205; H01L 29/42316; H01L 29/475; H01L 29/66462; H01L 29/7787
See application file for complete search history.

(56) References Cited

U.S. PATENT DOCUMENTS

| | | | | |
|---|---|---|---|---|
| 6,090,649 A * | 7/2000 | Suemitsu | ........ | H01L 21/28587 257/E21.222 |
| 6,180,440 B1 * | 1/2001 | Koganei | ........... | H01L 21/28575 257/E21.172 |
| 7,071,499 B2 * | 7/2006 | Bito | .................... | H01L 29/0843 257/192 |
| 7,456,444 B2 * | 11/2008 | Bito | .................. | H01L 29/7785 257/192 |
| 8,217,424 B2 * | 7/2012 | Yoshinaga | ........ | H01L 21/8252 257/192 |
| 2001/0019131 A1 * | 9/2001 | Kato | ................ | H01L 29/66462 257/76 |
| 2003/0107065 A1 * | 6/2003 | Taniguchi | ........ | H01L 21/28587 257/289 |
| 2010/0163849 A1 * | 7/2010 | Radosavljevic | ...... | B82Y 10/00 257/24 |
| 2012/0126291 A1 * | 5/2012 | Mitsunaga | ......... | H01L 27/0605 257/195 |
| 2013/0320400 A1 * | 12/2013 | Hurkx | .................. | H01L 29/417 257/192 |

* cited by examiner

*Primary Examiner* — Allan R Wilson
(74) *Attorney, Agent, or Firm* — White & Case LLP

(57) ABSTRACT

A P-N junction gate high electron mobility transistor (HEMT) device with a self-aligned gate structure and a method for making the HEMT device is disclosed. In one embodiment, the HEMT device includes a heterojunction comprising a barrier layer formed on a channel layer. A gate layer is formed on the barrier layer, the gate layer comprising a P-type group III-V semiconductor material suitable for depleting the carriers of a current conducting channel at the heterojunction when the HEMT device is off. A gate electrode comprising indium tin oxide (ITO) is formed on the gate layer, the gate electrode and the gate layer having substantially the same length.

11 Claims, 10 Drawing Sheets

SELF-ALIGNED ITO GATE ELECTRODE FOR GAN HEMT DEVICE

FIELD OF THE INVENTION

The invention relates generally to high electron mobility transistor (HEMT) devices, and particularly to P-N junction gate enhancement-mode HEMT devices having a self-aligned indium tin oxide (ITO) gate structure.

BACKGROUND OF THE INVENTION

The HEMT is a type of field effect transistor (FET) having a heterojunction between a channel layer and a barrier layer whose electron affinity is smaller than that of the channel layer. A group III-V HEMT device is one made of materials in column III of the periodic table, such as aluminum (Al), gallium (Ga), and indium (In), and materials in column V of the periodic table, such as nitrogen (N), phosphorus (P), and arsenic (As). A two-dimensional electron gas (2DEG) forms in the channel layer of a group III-V HEMT device due to the mismatch in polarization field at the channel-barrier layer interface. The 2DEG has a high electron mobility that facilitates high-speed switching during device operation.

In typical HEMT devices, the 2DEG arises naturally at the interface of the III-V materials forming the heterojunction, meaning the typical HEMT device will conduct current in the absence of a gate potential. In other words, the typical HEMT device is a normally "on" device. A negatively-biased voltage may be applied to the gate electrode to deplete the 2DEG and thereby turn off the device. Accordingly, the typical HEMT device is also referred to as a "depletion-mode" HEMT. However, the typical depletion-mode HEMT device's normally on state makes it unsuitable for many applications as the depletion-mode HEMT device conducts current before other circuitry is fully powered and operational.

To resolve this issue, a number of different approaches have been explored to create a normally "off", or "enhancement-mode" HEMT device. One of these approaches is to form a P-N junction gate to deplete the 2DEG by raising the potential of the current conducting 2DEG channel and therefore deplete the carriers from the channel at zero gate bias. FIG. 1 shows a cross-sectional view of a prior art structure for a P-N junction gate HEMT device. The HEMT device 100 shown in FIG. 1 comprises a substrate 102, a channel layer 104, and a barrier layer 106 formed in a stacked structure, with the heterojunction between the channel layer 104 and barrier layer 106 giving rise to a current carrying 2DEG channel. A gate layer 108 is formed on the barrier layer 106. The gate layer 108 is a P-type semiconductor material to raise the potential of the current carrying 2DEG channel. Electrodes 112 and 114 are formed on the barrier layer 108 to act as the source and drain, respectively, of the HEMT device 100. A gate electrode 110 is formed on the gate layer 108. During device operation of the foregoing HEMT device 100, a forward bias voltage relative to the substrate 102 is applied to the gate electrode 110 allowing a current to flow between the source electrode 112 and the drain electrode 114.

FIGS. 2A-2F shows cross-sectional views of the manufacturing steps for making the P-N junction gate HEMT device 100 of FIG. 1. In FIG. 2A, a gate layer 208 comprising a P-type semiconductor material is formed on a barrier layer 206, which in turn is formed on a channel layer 204 in a stacked structure on top of a substrate 202. A first mask layer 209 is deposited on the gate layer 208 for patterning of the gate layer 208. In FIG. 2B, exposed portions of the gate layer 208 that were not covered by the first mask layer 209 are etched away using a dry-etch process. The dry-etch process also removes the first mask layer 209.

In FIG. 2C, a second mask layer 211 is deposited over the gate layer 208 and the barrier layer 206 for patterning of the source and drain electrodes (shown in the next figure, FIG. 2G). A first metal layer 213 is deposited over the second mask layer 211 and the exposed portions of the barrier layer 206 not covered by the second mask layer 211. In FIG. 2D, a lift-off process is used to remove the second mask layer 211, taking along portions of the first metal layer 213 deposited on the second mask layer 211 and leaving only the portions of the first metal layer 213 deposited on the barrier layer 206, forming a source electrode 212 and a drain electrode 214. The source and drain electrodes 212 and 214 are then annealed at high temperature in a nitrogen ($N_2$) rich environment to form an ohmic contact with the barrier layer 206.

In FIG. 2E, a third mask layer 215 is deposited over the source and drain electrodes 212 and 214, the barrier layer 206, and a portion of the gate layer 208 for patterning of the gate electrode (shown in the next figure, FIG. 2F). A second metal layer 217 is deposited over the third mask layer 215 and the exposed portion of the gate layer 208. In FIG. 2F, a lift-off process is once again used to remove the third mask layer 215 and portions of the second metal layer 217, leaving only the portions of the second metal layer 217 deposited on the gate layer 208, forming a gate electrode 210. Typically, the gate electrode 210 for conventional P-N junction gate HEMT devices comprises a metal material, such as nickel gold (NiAu). Forming an ohmic contact between the metal gate electrode 210 and the P-type semiconductor gate layer 208 requires annealing the metal gate electrode 210 in a mixed oxygen ($O_2$) and nitrogen ($N_2$). However, the presence of oxygen ($O_2$) during the annealing of the gate electrode 210 will degrade the contact of the source and the drain electrodes 212 and 214, reducing the amount of current conducting from the source electrode 212 to the drain electrode 214.

In addition to degrading the source and drain electrode 212 and 214, there are a number of other issues with manufacturing a conventional P-N junction gate HEMT device 200 as shown in connection with FIGS. 2A-2F. To begin with, the alignment of the gate electrode 210 is difficult to control due to process variations during the patterning steps. Ideally, the gate electrode 210 will be centered on the gate layer 208. However, due to the realities of the manufacturing environment and because two patterning steps must be performed— one for the gate layer 208 and one for the gate electrode 210, deviations in the placement of the underlying gate layer 208 and the placement of the gate electrode 210 will frequently occur. This requires the length of the gate layer 208 to be much longer than the length of the gate electrode 210 to minimize the occurrence of the gate electrode 210 being placed off of the gate layer 208. In extreme cases, the gate electrode 210 may be offset such that it is formed off of the gate layer 208 and directly on the barrier layer 206, resulting in the shorting of the HEMT device and causing the HEMT device to be non-functional. To protect against shorting, if the gate electrode 210 is 2 µm in length, for example, than the gate layer 208 should be 3 µm-4 µm in length to account for misalignment between the gate electrode 210 and the gate layer 208 during manufacturing.

A longer gate layer 208 means the overall HEMT device must be larger, reducing the transistor density for a given semiconductor die area. Considering that most modern integrated circuits typically utilize hundreds of thousands to millions of transistors, high transistor density is highly desirable to maximize the number of integrated circuit dies formed on a single wafer to reduce manufacturing cost and for use in smaller end applications, such as mobile computing devices.

There is, therefore, an unmet demand for P-N junction gate HEMT devices having improved gate electrode alignment, improved conductivity, and allowing for a higher transistor density for a given semiconductor die area.

BRIEF DESCRIPTION OF THE INVENTION

In one embodiment, an HEMT device has a heterojunction comprising a barrier layer formed on a channel layer. The channel layer and the barrier layer comprise group III-V semiconductor materials. In one embodiment, the channel layer is gallium nitride (GaN). The barrier layer comprises a group III-V semiconductor material suitable for forming a heterojunction with the channel layer. In one embodiment, the barrier layer is aluminum gallium nitride (AlGaN).

The HEMT device further includes a gate layer formed on the barrier comprising a P-type group III-V semiconductor material suitable for depleting the carriers of a current conducting channel at the heterojunction when the HEMT device is off. The HEMT device further includes a gate electrode comprising indium tin oxide (ITO) formed on the gate layer and electrically coupled to the gate layer. The gate electrode forms an ohmic contact with the gate layer, and the gate electrode and the gate layer have substantially the same length.

The dimensions of the gate electrode and gate layer depend on the end application of the HEMT device. In one embodiment, the gate electrode and the gate layer have a length between 1 µm to 4 µm. In another embodiment, the gate electrode and the gate layer have a length less than 1 µm. In one embodiment, the gate layer has a thickness between 0.04 µm and 0.3 µm. In one embodiment, the gate electrode has a thickness between 0.04 µm and 0.3 µm. The HEMT device further includes a source electrode and a drain electrode electrically coupled to the barrier layer. The source electrode and the drain electrode form an ohmic contact with the barrier layer.

In one embodiment, a method of forming an HEMT device includes growing a channel layer comprising a group III-V semiconductor material on a substrate suitable for growing such materials. In one embodiment, the channel layer is gallium nitride. In one embodiment, the channel layer is grown using Metal Organic Chemical Vapor Deposition (MOCVD). In another embodiment, the channel layer is grown using Molecular Beam Epitaxy (MBE). The method further includes forming a barrier layer on the channel layer, the barrier layer comprising a group III-V semiconductor material suitable for forming a heterojunction with the channel layer. In one embodiment, the barrier layer comprises aluminum gallium nitride. In one embodiment, the barrier layer is grown using Atomic Layer Deposition (ALD). In other embodiments, the barrier layer is grown using MOCVD or MBE.

The method further includes growing a gate layer comprising a P-type group III-V semiconductor material on the barrier layer, the P-type group III-V semiconductor material suitable for depleting the carriers of a current conducting channel at the heterojunction when the HEMT device is off. In one embodiment, the gate layer is P-type gallium nitride (P-GaN). In one embodiment, the gate layer is grown to a thickness between 0.04 µm and 0.3 µm. The method further includes depositing a gate electrode layer comprising indium tin oxide (ITO) over the gate layer. In one embodiment, the gate electrode layer is deposited using an electron beam evaporation process. In another embodiment, the gate electrode layer is deposited using a sputtering process. In one embodiment, the gate electrode layer is deposited to a thickness between 0.04 µm and 0.3 µm.

The method further includes patterning the gate electrode layer by depositing a first mask layer over the gate electrode layer. The method further includes removing the regions of the gate electrode layer that are not covered by the first mask layer using a wet-etch process to form a gate electrode. The wet-etch process does not remove the first mask layer. The method further includes removing the regions of the gate layer that do not underlie the gate electrode and the first mask layer, resulting in a gate layer that is substantially the same length as the gate electrode. In one embodiment, the gate electrode and the gate layer have a length between 1 µm to 4 µm. In another embodiment, the gate electrode and the gate layer have a length less than 1 µm. The dry-etch process also removes the first mask layer.

The method further includes depositing a source and a drain electrode on the barrier layer of the HEMT device, the source and drain electrodes comprising a material suitable for forming an ohmic contact with the barrier layer. The method further includes simultaneously annealing the gate electrode, and the source electrode and drain electrodes in a nitrogen ($N_2$) rich environment, with substantially no oxygen ($O_2$), to form an ohmic connection with the gate layer and the barrier layer, respectively.

DETAILED DESCRIPTION OF THE INVENTION

Figure 3:
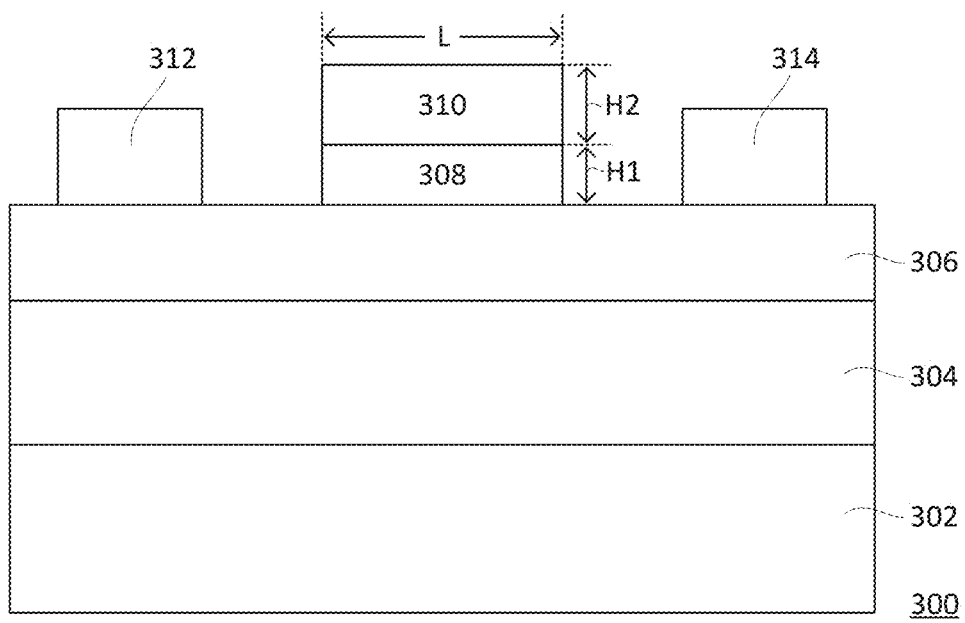
FIG. 3 shows a cross-sectional view of a P-N junction gate HEMT device according to one embodiment of the invention.

FIG. 3 shows a cross-sectional view of a P-N junction gate HEMT device 300 according to one embodiment of the invention. In FIG. 3, a P-N junction gate HEMT device 300 begins with a substrate 302. Substrate 302 can be silicon (Si), silicon carbide (SiC), sapphire ($Al_2O_3$), bulk gallium nitride (GaN), or any other suitable substrate for epitaxially growing a group III-V material. A channel layer 304 is formed on top of the substrate 302. Channel layer 304 comprises a group III-V material. In one embodiment, channel layer 304 comprises a group III-nitride material, such as gallium nitride.

A barrier layer 306 is formed on the channel layer 304. The barrier layer 306 comprises a material suitable for forming a heterojunction with the channel layer 304. The resulting difference in the polar properties between the semiconductor material of the channel layer 304 and the barrier layer 306 give rise to a fixed charge at their interface, or heterojunction. The fixed charge attracts mobile electrons in the HEMT device 300 resulting in a current carrying 2DEG channel at the heterojunction. In one embodiment, the channel layer 304 comprises gallium nitride and the barrier layer 306 comprises aluminum gallium nitride (AlGaN).

A gate layer 308 is formed on the barrier layer 306. The gate layer 308 comprises a P-type group III-V material suitable for raising the potential of the current conducting 2DEG channel to deplete the carriers from the channel at zero gate bias. In one embodiment, the gate layer 308 comprises a P-type gallium nitride (P-GaN) material. A self-aligned gate electrode 310 is formed on, and electrically coupled to, the gate layer 308. The gate electrode 310 comprises, for example, indium tin oxide (ITO). The gate electrode 310 forms an ohmic contact with the gate layer 308. The gate electrode 310 is aligned with the gate layer 308 and has substantially the same length as the underlying gate layer 308. As used herein, the "length" of a gate or corresponding electrode refers to the line width dimension or the dimension in a direction between a source and drain region of a transistor. Further, it is recognized that there may be slight deviation between the length of the gate electrode 310 and the gate layer 308 due to manufacturing variations and tolerances.

The dimensions of the gate electrode 310 and the gate layer 308 will depend on the end-application of the HEMT device 300. For high-power applications, a longer and thicker gate electrode 310 and gate layer 308 may be required. In one embodiment, the gate electrode 310 and the gate layer 308 have a length, L, between 1 μm and 4 μm. In another embodiment, the gate electrode 310 and the gate layer 308 have a length, L, less than 1 μm. In one embodiment, the gate layer 308 is between 0.04 μm and 0.3 μm thick (H1). In one embodiment, the gate electrode 310 is between 0.04 μm and 0.3 μm thick (H2).

Figure 1:
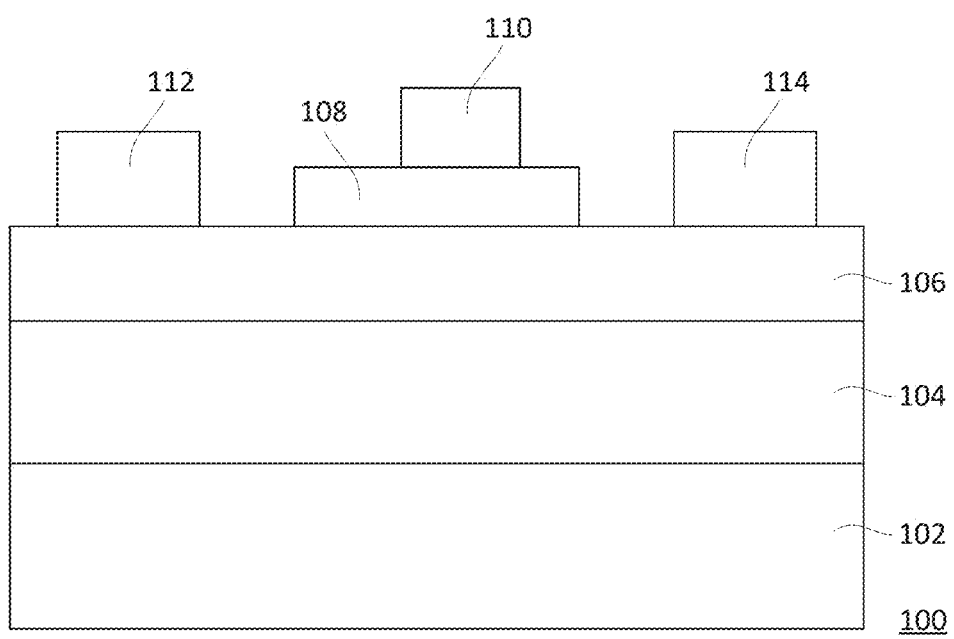
FIG. 1 shows a cross-sectional view of a prior art structure for a P-N junction gate HEMT device.
Figure 2A:
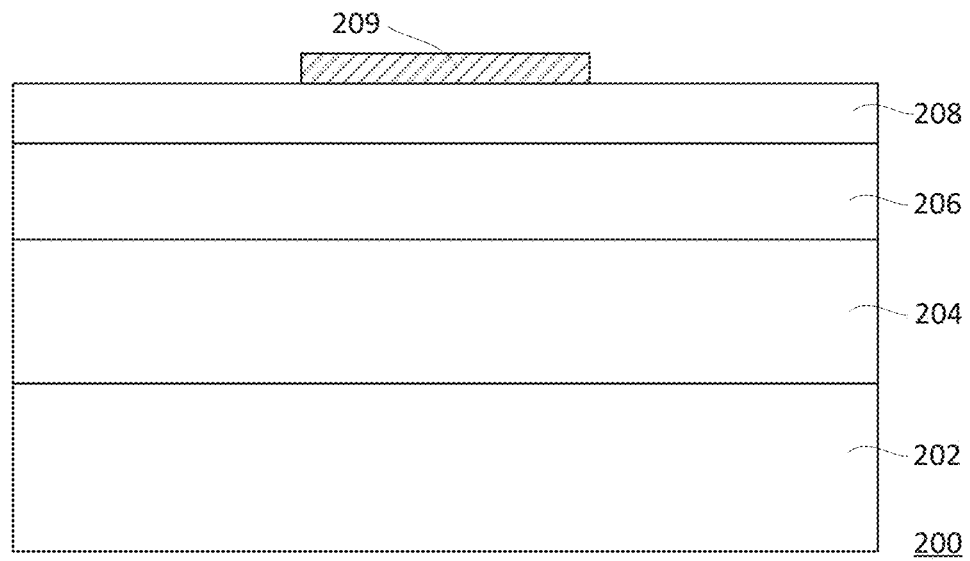
FIG. 2A-2F shows cross-sectional views of the manufacturing steps for producing the P-N junction gate HEMT device of FIG. 1.
Figure 2B:
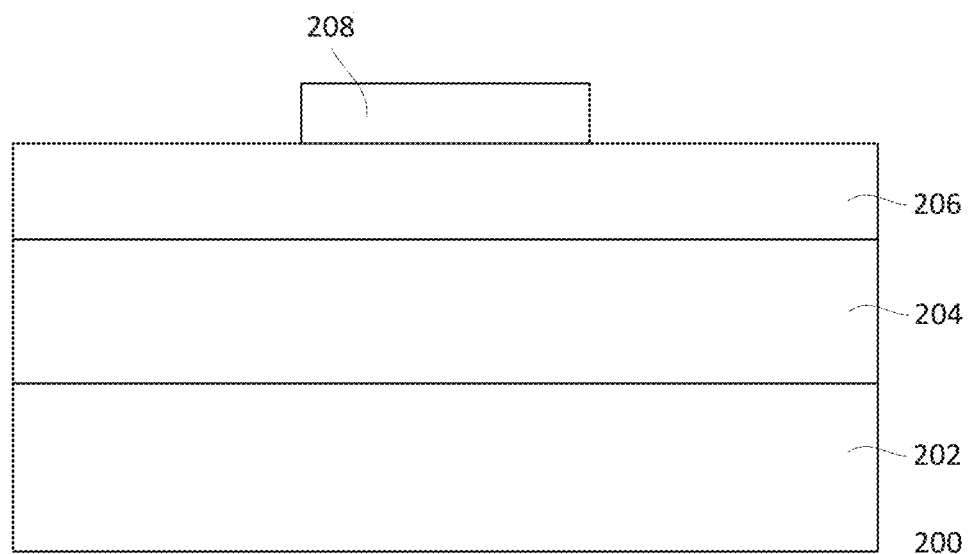
Figure 2C:
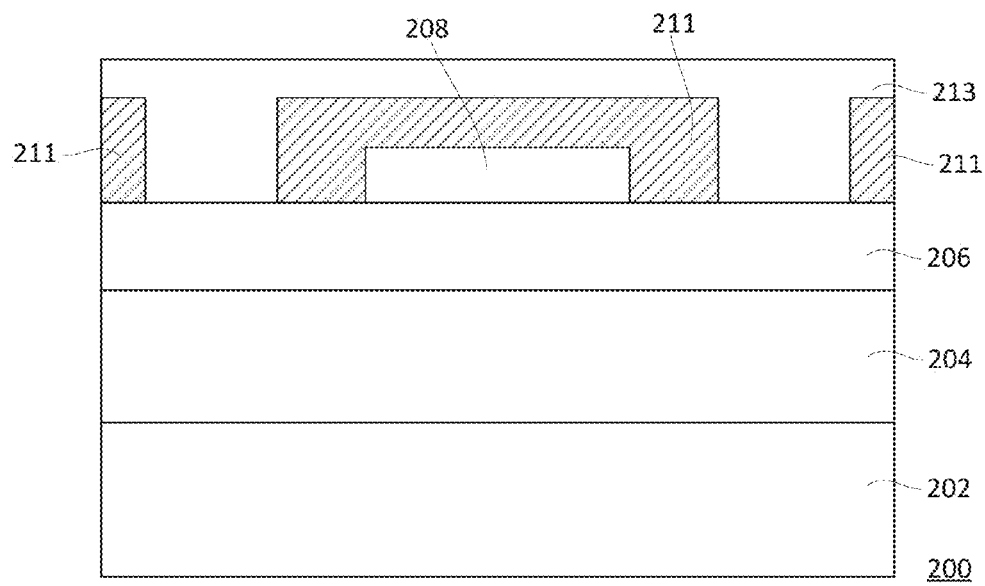
Figure 2D:
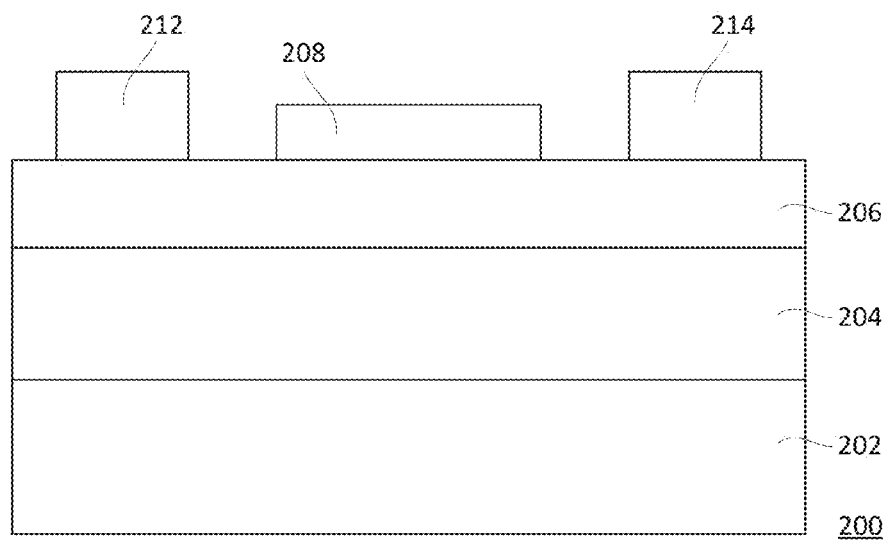
Figure 2E:
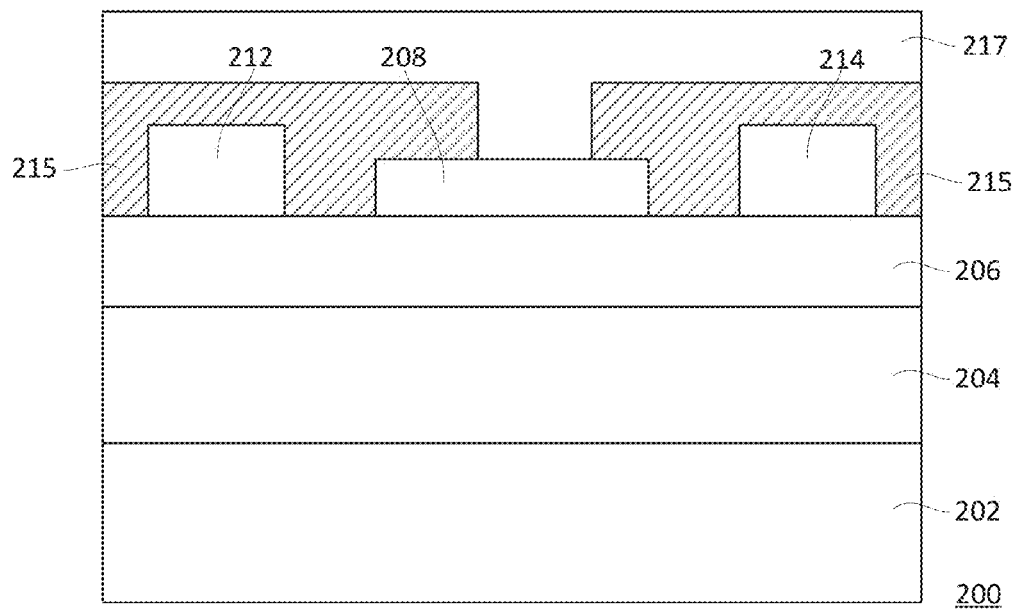
Figure 2F:
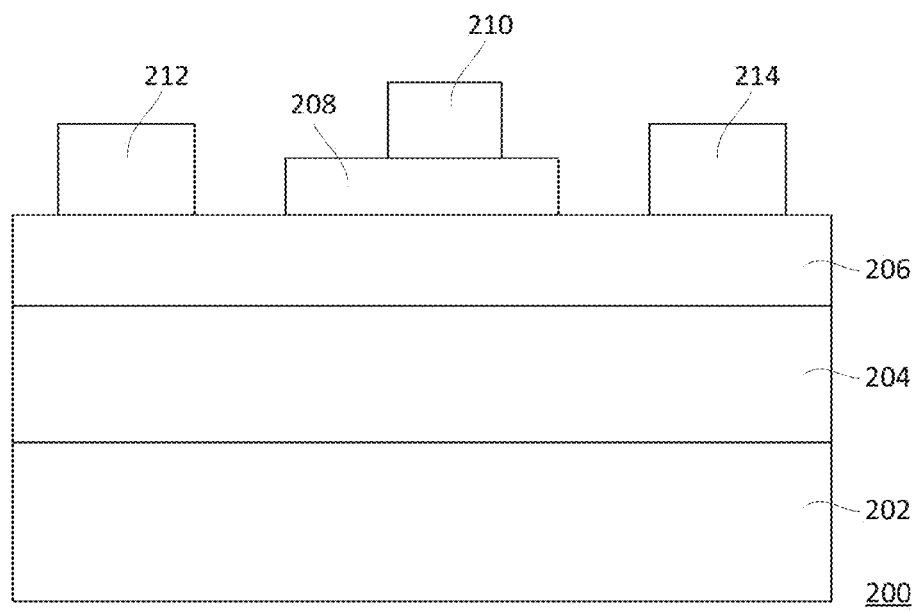

A source electrode 312 and a drain electrode 314 are formed on, and electrically coupled to, the barrier layer 308. The source electrode 312 and the drain electrode 314 may comprise any material suitable to form an ohmic contact with the barrier layer 306, such as titanium (Ti), silicon (Si), nickel (Ni), aluminum (Al), tungsten (W), or any combination or alloy thereof. During device operation, when a positive bias voltage relative to the substrate 302 is applied to the gate electrode 310, a current will flow between the source and drain electrodes 312 and 314. Because the gate electrode 310 is aligned with the underlying gate layer 308, and has substantially the same length, L, the P-N junction gate HEMT device 300 will have better electrical performance than the prior art HEMT device 100 shown and described in connection with FIG. 1.

Figure 4A:
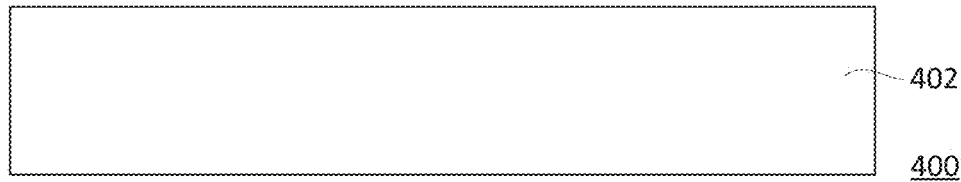
FIGS. 4A-4I shows cross-sectional views of the manufacturing steps for producing the P-N junction gate HEMT device of FIG. 3, according to one embodiment of the invention.
Figure 4B:
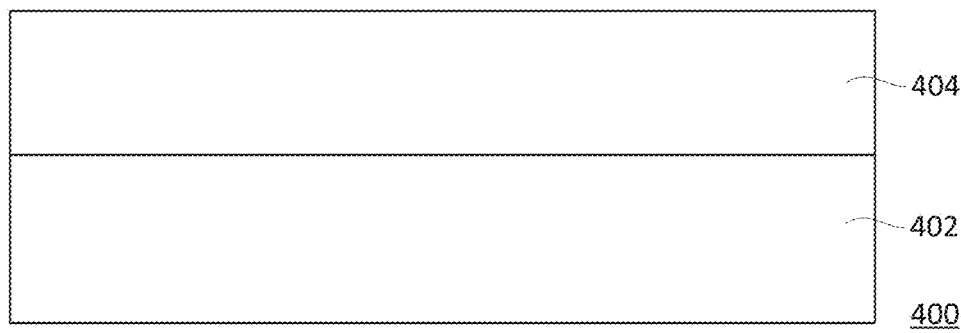

FIGS. 4A-4J shows cross-sectional views of the manufacturing steps for producing the P-N junction gate HEMT device 300 of FIG. 3, according to one embodiment of the invention. In FIG. 4A, the formation of a P-N junction gate HEMT device 400 begins by providing a substrate 402. Substrate 402 can be silicon, silicon carbide, sapphire, bulk gallium nitride, or any other suitable substrate material for epitaxially growing a group III-V material. In FIG. 4B, a channel layer 404 is formed on the substrate 402. Channel layer 404 comprises a group III-V material, such as gallium nitride.

Channel layer 404 may be formed by any known process, such as placing substrate 402 in a Metal Organic Chemical Vapor Deposition (MOCVD) reactor and epitaxially growing the channel layer on the substrate 402. Alternatively, the channel layer 404 may be grown using Molecular Beam Epitaxy (MBE). The thickness of the channel layer 404 will depend on the desired application of the HEMT device 400. For example, for a low power application applying 40V, the channel layer 404 may be grown to a thickness of 0.5 μm. However, for high power applications in excess of 1000V-1200V, the channel layer 404 should be grown to a greater thickness, such as 5 μm to 6 μm.

Figure 4C:
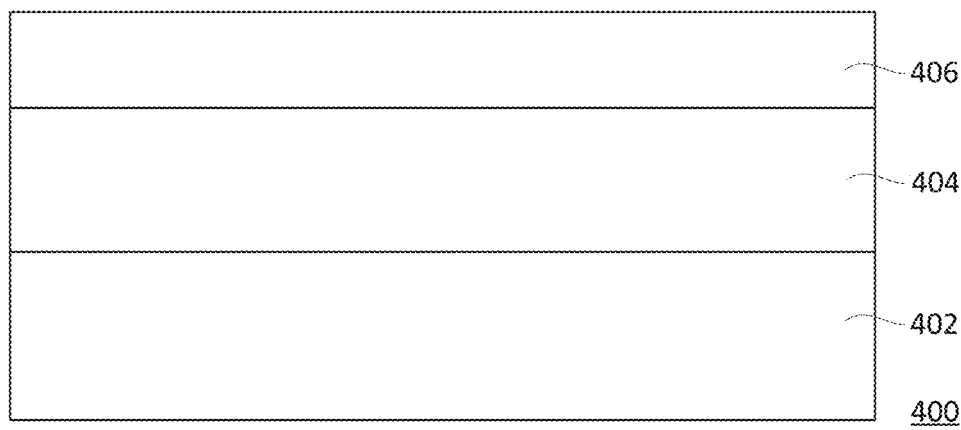

In FIG. 4C, a barrier layer 406 is formed on the channel layer 404. The barrier layer 406 comprises a group III-V material having a different polar property than the channel layer 404 to introduce a fixed charge at the heterojunction of the barrier layer 406 and the channel layer 404. In one embodiment, the channel layer 404 comprises gallium nitride and the barrier layer 406 comprises aluminum gallium nitride. The thickness of the barrier layer 406 will determine the magnitude of the polarization induced fixed charge at the heterojunction of the channel layer 404 and barrier layer 406, which in turn will determine the conductivity of the current carrying 2DEG channel. For applications that require greater conductivity, the barrier layer 406 should be formed thicker. Conversely, for applications that require less conductivity, the barrier layer 406 can be made thinner. In one embodiment, the barrier layer has a thickness between 0.01 μm and 1 μm Like the channel layer 404, the barrier layer 406 can be formed by any known process, including MOCVD and MBE. In the embodiment where the barrier layer is thin, for example 0.015 μm, Atomic Layer Deposition (ALD), a more precise process than MOCVD and MBE, is preferably used to form the layer of thin material.

Figure 4D:
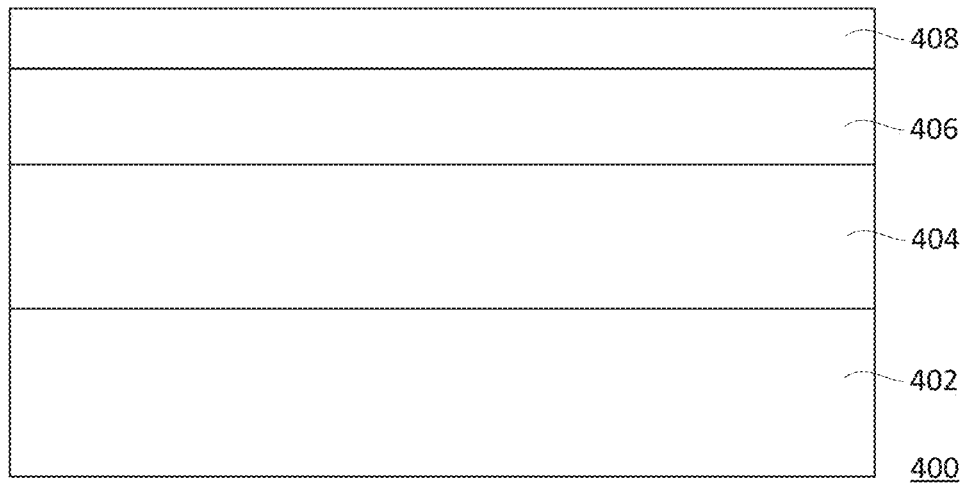

In FIG. 4D, a gate layer 408 is formed on the barrier layer 406. As previously discussed, the gate layer 408 comprises a P-type group III-V material suitable for raising the potential of the current conducting 2DEG channel to deplete the carriers from the channel at zero gate bias. In one embodiment, the gate layer 408 is P-type gallium nitride. Like the channel layer 404, the thickness of the gate layer 408 will depend on the end-application of the HEMT device 300. In one embodiment, the gate layer 408 is between 0.04 μm and 0.3 μm thick.

Figure 4E:
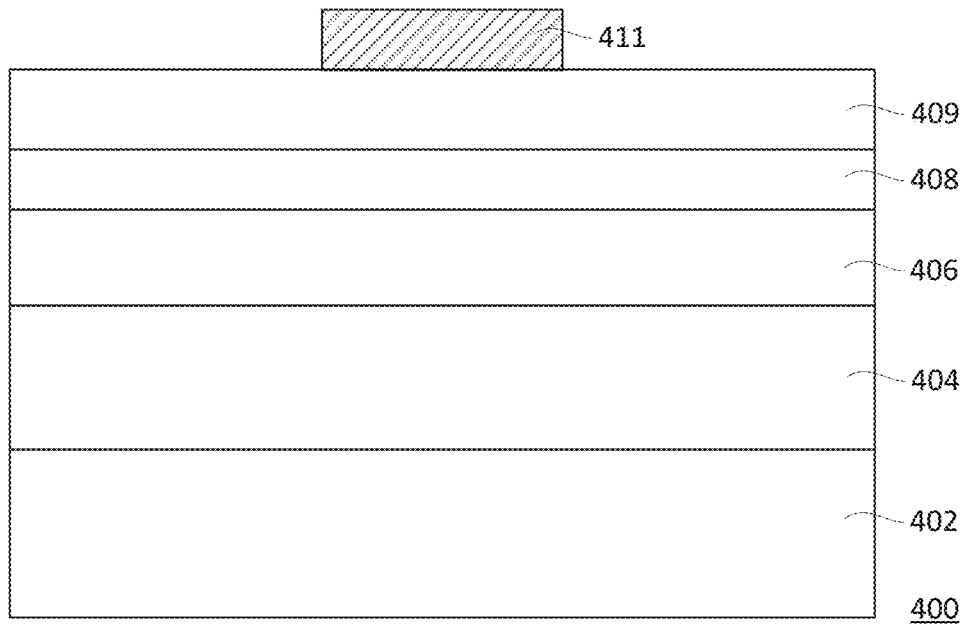
Figure 4F:
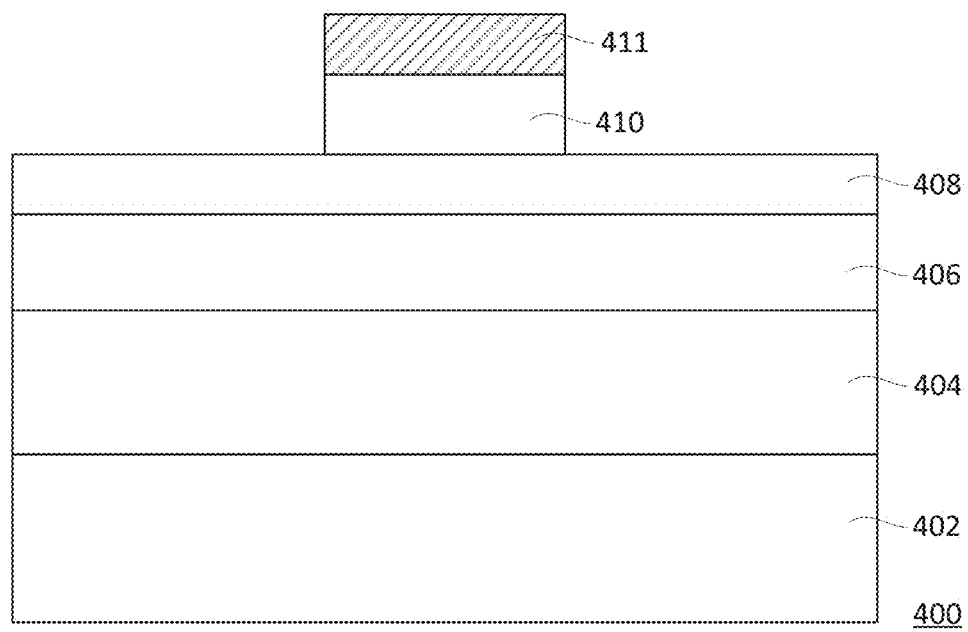

In FIG. 4E, a layer of indium tin oxide 409 is deposited on the gate layer 408. A first mask layer 411 is deposited on the layer of indium tin oxide 409 for patterning of a gate electrode (shown in the next figure, FIG. 4F) and the gate layer 408. In one embodiment, the layer of indium tin oxide 409 is deposited using an electron beam evaporation process. In another embodiment, the layer of indium tin oxide is deposited using a sputtering process. As the layer of indium tin oxide 409 will eventually be formed into a gate electrode, the thickness of the layer of indium tin oxide 409 will depend on the end-application of the HEMT device 300 as previously discussed. In one embodiment, the layer of indium tin oxide 409 is between 0.04 μm and 0.3 μm thick. In FIG. 4F, exposed portions of the layer of indium tin oxide 409 that were not covered by the first mask layer 411 are etched away using a wet-etch process, forming a gate electrode 410. Unlike the prior art gate electrode 110 of FIG. 1 comprising a metal material, indium tin oxide can be etched using a wet-etch process. The wet-etch process leaves the first mask layer 411 intact.

Figure 4G:
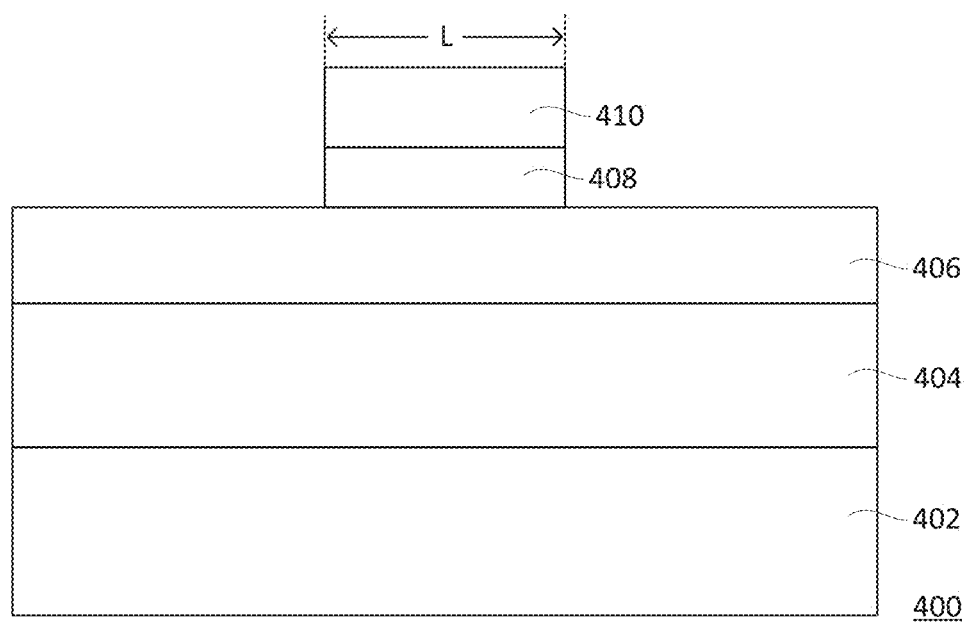

In FIG. 4G, a dry-etch process is used to remove portions of the gate layer 408 that do not underlie the gate electrode 410 and the first mask layer 411. The dry-etch process also removes the first mask layer 411. By first using a wet-etch process to etch the layer of indium tin oxide 409 in FIG. 4F, the first mask layer 411 is preserved and the first mask layer 411 can be used again for the dry-etch process for the gate layer 408. Thus, only a single mask layer is required to etch both the layer of indium tin oxide 409 and the gate layer 408, thereby reducing the number of processing steps required to manufacture the HEMT device 400 compared to the prior art HEMT device 100 of FIG. 1.

Further, because only a single mask layer is used, there is no risk of misalignment of the gate electrode 410 and the underlying gate layer 408 as only the portions of the gate layer 408 that do not underlie the gate layer 408 are removed as shown in the step of FIG. 4G. Accordingly, the gate electrode 410 and the gate layer 408 are substantially the same length. The length of the gate electrode 410 and the gate layer 408 will again depend on the requirements of the end application of the HEMT device 400. In one embodiment, the gate electrode 410 and the gate layer 408 have a length, L, between 1 µm and 4 µm as shown in FIG. 4G. In another embodiment, the gate electrode 410 and the gate layer 408 have a length, L, less than 1 µm, as shown in FIG. 4G.

Figure 4H:
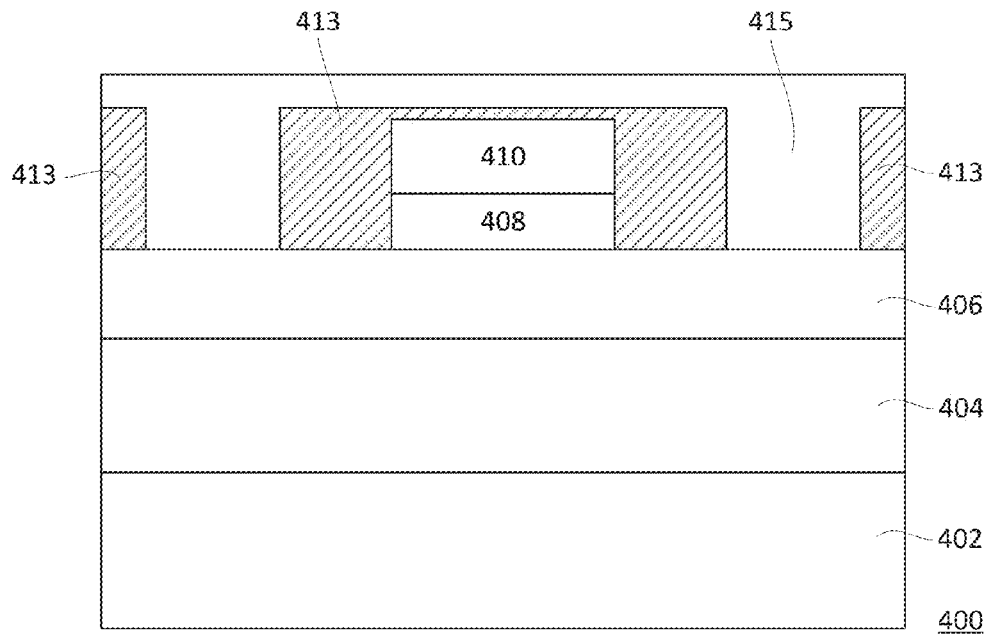
Figure 4I:
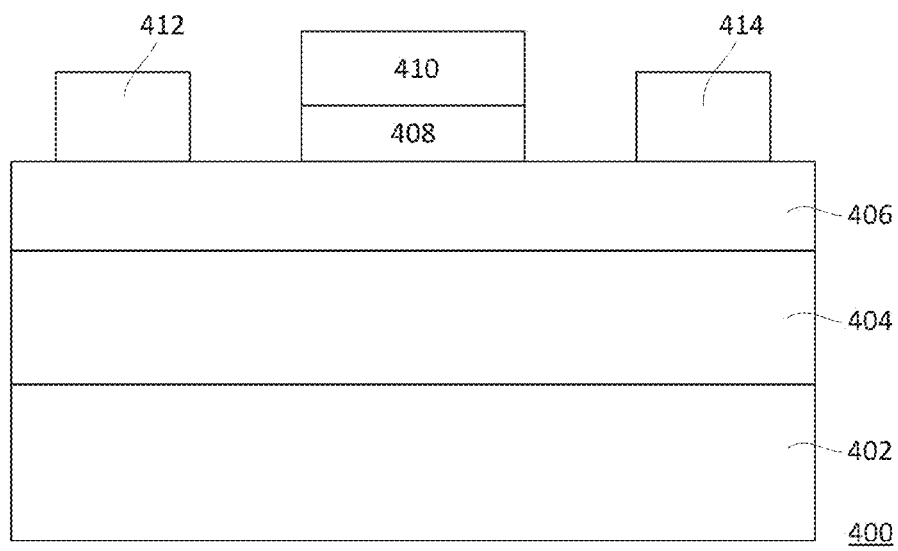

In FIG. 4H, a second mask layer 413 is deposited over the gate electrode 410, the gate layer 208, and portions of the barrier layer 406 for patterning of the source and drain electrodes (shown in the next figure, FIG. 4I). A metal layer 415 is deposited over the second mask layer 413 and the exposed portions of the barrier layer 406 not covered by the second mask layer 413. The metal layer 415 comprises any suitable material for forming an ohmic contact with the underlying barrier layer 406, such as titanium, silicon, nickel, aluminum, tungsten, or any combination or alloy thereof. In one embodiment, the metal layer 415 comprises layers of suitable metals to form a metal layer stack, such as titanium/aluminum, titanium/aluminum/titanium nitride (TiN), or titanium/aluminum/tungsten.

In FIG. 4I, a lift-off process is used to remove the second mask layer 413, taking along portions of the metal layer 415 deposited on the second mask layer 413 and leaving only the portions of the metal layer 415 deposited on the barrier layer 406, forming a source electrode 412 and a drain electrode 414. The gate electrode 410, and the source and drain electrodes 412 and 414, are then annealed simultaneously at high temperature, typically between 500° C. to 900° C., in a nitrogen ($N_2$) rich environment substantially free of oxygen ($O_2$) to form an ohmic contact with the gate layer 408 and the barrier layer 406, respectively. Unlike the metal gate electrode 110 of the prior art HEMT device 100 shown in FIG. 1, the indium tin oxide gate electrode 410 does not require annealing in oxygen to form an ohmic contact with the P-type semiconductor gate layer 408. As such, only one annealing step is required during the manufacturing process of the HEMT device 400, and the contact of the source electrode 412 and drain electrode 414 are not degraded.

The manufacturing process of the P-N junction gate HEMT device 400 as described and shown in FIGS. 4A-4I realizes a number of advantages over the manufacturing process of the prior art P-N junction gate HEMT device 200 described and shown in FIGS. 2A-2F. First, the process of FIGS. 4A-4I requires fewer manufacturing steps as only a single mask layer is used to form both the gate electrode 410 and the underlying gate layer 408; and the gate electrode 410, the source electrode 412, and the drain electrode 414 are annealed simultaneously. By utilizing fewer steps in the manufacturing process, the P-N junction gate HEMT device 400 will be cheaper and faster to produce than prior art devices.

Second, because only a single mask layer is used (due to indium tin oxide's ability to be etched using a wet-etch process that maintains the first mask layer 411), there is no misalignment of the gate electrode 410 and the underlying gate layer 408, making it unnecessary for the gate layer 408 to be longer than the gate electrode 410. This allows the P-N junction gate HEMT device 400 to be smaller than prior art devices. For example, if the end application requires a gate electrode 410 length of 2 µm, the gate layer 408 is also 2 µm. Recall for the prior art HEMT device 100 of FIG. 1, in order to have a gate electrode 110 of 2 µm, the gate layer 108 must be longer than 2 µm to account for misalignment of the gate electrode 110 and the gate layer 108, requiring the HEMT device 100 to be larger than the P-N junction gate HEMT device 400. A smaller device means that the P-N junction gate HEMT device 400 allows for higher transistor density and further reduced manufacturing costs as smaller semiconductor die sizes are needed to fit the same number of transistors for a given integrated circuit, and in turn, allowing for more die to fit onto a single wafer.

Third, as there is no misalignment of the gate electrode 410 and the underlying gate layer 408, the manufacturing process of FIGS. 4A-4I will realize a better yield as the gate electrode 410 cannot be offset from the gate layer 408 to cause a short in the P-N junction HEMT device 400.

Finally, the contact of the source and drain electrodes 412 and 414 are not degraded (because no annealing with oxygen was performed), improving the amount of current conducting from the source electrode 412 to the drain electrode 414. In short, the manufacturing process shown in FIGS. 4A-4I results in a P-N junction gate HEMT device that is cheaper to manufacture, smaller, will result in higher yield, and has improved electrical performance compared to prior art devices.

Figure 5:
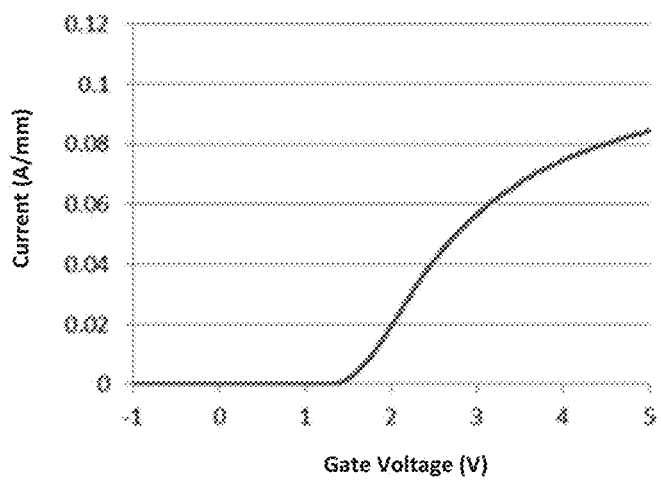
FIG. 5 shows a plot of the conductivity as a function of gate voltage of a P-N junction gate HEMT device according to the prior art.
Figure 6:
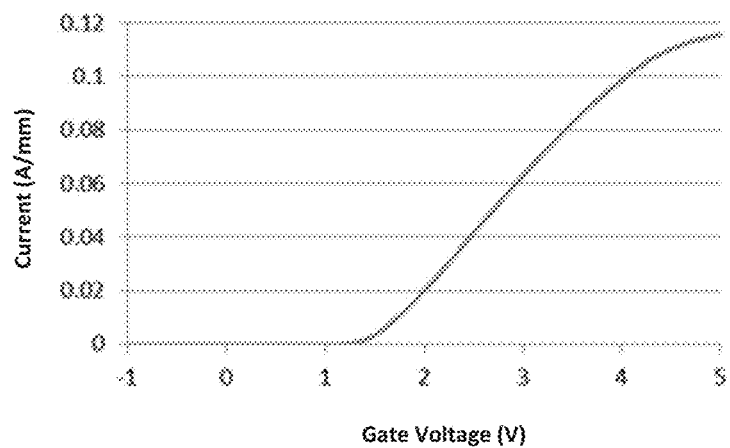
FIG. 6 shows a plot of the conductivity as a function of gate voltage of a P-N junction gate HEMT device according to one embodiment of the invention.

FIG. 5 shows a plot of the conductivity as a function of gate voltage of a P-N junction gate HEMT device according to the prior art. FIG. 6 shows a plot of the conductivity as a function of gate voltage of a P-N junction gate HEMT device according to one embodiment of the invention. The P-N junction gate HEMT devices of FIGS. 5 and 6 have the same channel layer thickness, barrier layer thickness, and gate electrode thickness. The only difference is the length of the gate layer underlying the gate electrode of the prior art P-N junction HEMT device of FIG. 5, due to the need to form the gate layer longer for the prior art device to account for misalignment. The prior art P-N junction gate HEMT device of FIG. 5 has a gate electrode length of 2 µm and a gate layer length of 3 µm, and the P-N junction gate HEMT device of FIG. 6 has a gate electrode length and a gate layer length of 0.2 µm.

As shown in FIGS. 5 and 6, the threshold voltage to turn on the P-N junction HEMT devices are the same, 1.5V (due to the same gate electrode lengths of 2 µm and other identical parameters aside from the length of the gate layer), however the prior art HEMT device of FIG. 5 conducts less current at increasing gate voltages compared to the HEMT device of FIG. 6. As previously explained, the offset in the gate electrode and gate layer of the prior art P-N junction gate HEMT devices along with the degraded contact of the source and drain electrodes contribute to decreased current conductivity. The contact resistance of the source and drain electrodes of the prior art HEMT device was measured to be $5.38 \times 10^{-4}$ $\Omega/cm^2$, compared to the contact resistance of the HEMT device according to one embodiment of the invention was measured to be $5.24 \times 10^{-5}$ $\Omega/cm^2$—a full order of magnitude lower than the prior art HEMT device. As shown in FIGS. 5 and 6, at a gate voltage of 5V, the prior art HEMT device (FIG. 5) only conducts 0.085 A/mm of current whereas the HEMT device according to one embodiment of the present invention (FIG. 6) conducts 0.115 A/mm of current—a 26% improvement over the prior art HEMT device.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A method of forming a high electron mobility transistor (HEMT) comprising:
   providing a substrate;
   forming a channel layer comprising a group III-V semiconductor material on the substrate;
   forming a barrier layer comprising a group III-V semiconductor material on the channel layer to create a heterojunction;
   forming a gate layer comprising a P-type group III-V semiconductor material on the barrier layer;
   depositing a gate electrode layer comprising indium tin oxide (ITO) on the gate layer;
   patterning the gate electrode layer;
   etching the gate electrode layer to form a gate electrode using a wet-etch process; and
   etching the gate layer using a dry-etch process,
   wherein the gate electrode and the gate layer have substantially the same length.

2. The method of claim 1, further comprising:
   forming a source electrode and a drain electrode on the barrier layer after etching the gate layer; and
   annealing the source electrode, the drain electrode, and the gate electrode in a nitrogen ($N_2$) rich environment, with substantially no oxygen ($O_2$).

3. The method of claim 1, wherein the gate electrode layer is deposited using an electron beam evaporation process.

4. The method of claim 1, wherein the gate electrode layer is deposited using a sputtering process.

5. The method of claim 1, wherein the channel layer comprises gallium nitride (GaN).

6. The method of claim 1, wherein the barrier layer comprises aluminum gallium nitride (AlGaN).

7. The method of claim 1, wherein the gate layer comprises gallium nitride (GaN).

8. The method of claim 1, wherein the length of the gate electrode and gate layer is between 1 μm to 4 μm.

9. The method of claim 1, wherein the length of the gate electrode and gate layer is 1 μm or less.

10. The method of claim 1, wherein the gate electrode has a thickness between 0.04 μm and 0.3 μm.

11. The method of claim 1, wherein the gate layer has a thickness between 0.04 μm and 0.3 μm.

* * * * *